AMBIENT ATMOSPHERE ISOLATED SEMICONDUCTOR DEVICES

Filed Sept. 2, 1965 2 Sheets-Sheet 1

INVENTOR

Dale B. De Vries

BY John D. Graham

ATTORNEY

AMBIENT ATMOSPHERE ISOLATED SEMICONDUCTOR DEVICES

Filed Sept. 2, 1965 2 Sheets-Sheet 2

INVENTOR
Dale B. De Vries
BY
John D. Graham
ATTORNEY

United States Patent Office 3,475,664

Patented Oct. 28, 1969

3,475,664
AMBIENT ATMOSPHERE ISOLATED SEMICONDUCTOR DEVICES

Dale Byron DeVries, Richardson, Tex., assignor to Texas Instruments, Dallas, Tex., a corporation of Delaware Filed Sept. 2, 1965, Ser. No. 484,535
Int. Cl. H01l 11/10
U.S. Cl. 317—235 7 Claims

ABSTRACT OF THE DISCLOSURE

Disclosed are integrated circuit devices which use the ambient fabrication atmosphere as an isolation medium between elements of the circuit, such devices having improved mechanical structure, improved surface area for attaching lead wires, reduced collector area, and lower stray capacitance.

This invention relates to semiconductor devices, including integrated circuits and to methods of making same. More particularly, it relates to integrated circuit devices which use the ambient fabrication atmosphere as an isolation medium between elements of the circuit.

In high frequency integrated circuit it is desirable to electrically isolate various elements of the circuit by some means which produces a lower capacitive coupling between them than that afforded by the conventional PN junction isolation. PN junction isolation is achieved by the use of the high resistance, reverse-bias characteristics of such a junction, said junction being physically located between the elements to be isolated. There are two common ways of building a PN junction isolation region, namely, that of using a diffused collector and that of using an epitaxial collector. Because the reverse biased PN junction can only be used up to a voltage which is determined by the impurity concentrations at the collector-isolation junction, both of these methods produce devices which are voltage limited. In order to make a transistor having a low collector saturation resistance (R*cs*), it is necessary to have a high surface impurity concentration. This high impurity concentration causes the concomitant PN junction breakdown voltage to be low. Thus, the conventional PN junction isolation makes it quite difficult to fabricate a device having both high voltage breakdown and low R*cs* characteristics.

A second disadvantage of PN junction isolation is the capacitive coupling which, existing between isolated islands and the substrate, seriously impairs the ability of the device to operate at the higher frequencies.

There is also a problem in controlling the PNPN action of the active PN junction, such as in a transistor or diode, coupled with the isolation PN junction. This problem can be lessened somewhat by introducing a second epitaxial layer which is, for example, highly N-doped for the case of P-type substrate. This solution is nonetheless plagued with the same problem of attempting to fabricate a low R*cs*, high collector-base breakdown voltage device.

As integrated circuit technology advances, additional active and passive elements are being crowded into monolithic semiconductor networks, increasing the number of such elements thereon, and placing them into progressively smaller spaces. The necessary reduction in the size of the elements presents a serious problem when attempting to make internal connections between the elements and connections external thereto. A technique to make these connections has been previously developed for making a solid package wherein the bonding of jumper wires is rendered unnecessary by constructing a multilayer lead device with interconnections in thin layers and insulated from the other layers by an insulating material. In this manner, large contact areas are provided for making external connections to the devices of the network.

Beam lead techniques using thick leads for mechanical support have also been developed which utilize air insulation between the components. However, such techniques do not lend themselves to the aforedescribed multilayer lead system because of the thickness of the leads.

It is therefore an object of the present invention to provide a method of fabricating an integrated circuit device which uses the ambient fabrication atmosphere (air, for example) as the insulation medium between the elements of the circuit and which has an improved mechanical structure.

It is yet another object of the invention to provide an integrated circuit device having an improved surface area for attaching lead wires thereto.

Transistors are conventionally fabricated in such a manner as to place the collector surface of the device in contact with a header portion. Thus the emitter and base regions, as in a planar diffused device, are exposed to view from the surface opposite that of the collector surface. However, this type of fabrication results in the relatively small emitter and base regions being embedded in a collector region which is relatively thick and of large area. Because the area of the collector is large, there is a large stray capacitance between the collector and the can (cap or lid) of the device, such capacitance being usually undesirable in high frequency applications. Such a fabrication also places a limitation upon how small a semiconductor device can be built, since the entire collector region is always larger than that portion of the collector which is used in the transistor action. Although these limitations have been described in relation to a transistor, they are equally true in relation to other semiconductor devices, such as capacitors, diodes, field-effect transistors and the like.

It is therefore a further object of the invention to provide a semiconductor device and a method of making the same which has a reduced collector area and a lower stray capacitance.

Likewise, it is another object of the invention to provide an integrated circuit device having semiconductor devices therein which have active regions of reduced area and lower stray capacitance.

It is yet another object to provide a semiconductor device and method of making the same which has an improved surface area for attaching lead wires thereto.

Other objects and features of the invention will be more readily understood from the following detailed description when read in conjunction with the appended claims and attached drawings, in which:

The invention, in brief, comprises an integrated circuit device and a method of making the same which utilizes the ambient fabrication atmosphere as the insulation medium between the elements, or components, of the circuit, wherein the device is characterized by the components being mounted "upside-down" on the substrate. The invention also contemplates a single semiconductor device, a transistor for example, which is mounted with the emitter, base and possibly the collector regions adjacent to the substrate.

Each embodiment of the invention utilized one or more "islands" of high conductivity semiconductor material between the metallized contacts which are in intimate relationship with the active semiconductor regions of a given device and the metallic pads to which lead wires may be attached.

Figures 1, 2, 3, 4:
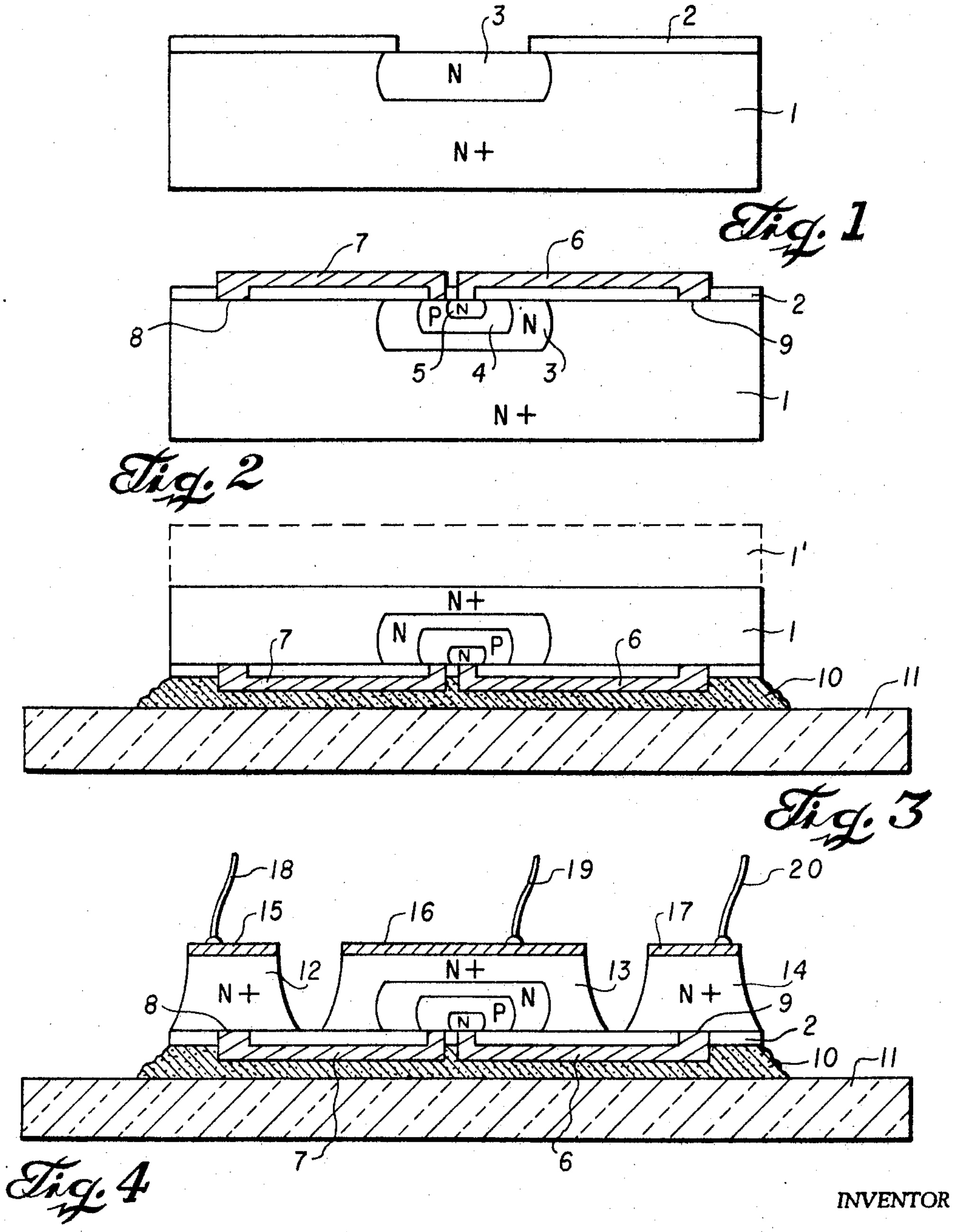
FIGURE 1 illustrates a sectional view of a semiconductor wafer having a vapor-etched and redeposited semiconductor region therein.
FIGURE 2 illustrates a sectional view of the wafer of FIGURE 1 having diffused base and emitter regions in the redeposited region.
FIGURE 3 illustrates a sectional view of the device of FIGURE 2 mounted upon an insulating substrate according to the invention and inverted.
FIGURE 4 illustrates a sectional view of the mounted device of FIGURE 3 having etched-out regions therein according to the invention.

For a more detailed description, with specific reference to FIGURE 1, there is shown a semiconductor wafer 1, for example highly doped N-type (commonly referred to as N+) silicon, having an oxide layer 2. By conventional selective masking and etching processes a portion of the layer 2 is removed and a region of the wafer 1 is then vapor etched to leave a cavity, not illustrated. Subsequent to the vapor etching step the cavity is filled with a less highly doped N-type silicon material 3 by a conventional redeposition process.

FIGURE 2 illustrates how a transistor is formed in the collector region 3, having a conventional diffused base region 4 and a conventional emitter region 5, both of the diffused regions being the result of conventional photomasking and diffusion processes well-known in the semiconductor industry. Metallized contacts 6 and 7 are then applied by conventional evaporation processes to the emitter region 5 and the base region 4, respectively. The contact region 7 also extends through the oxide layer 2 to form a contact 8 with the N+ region 1, while the contact region 6 extends through the oxide layer 2 to form a contact 9 with the N+ region 1.

Figures 6, 7:
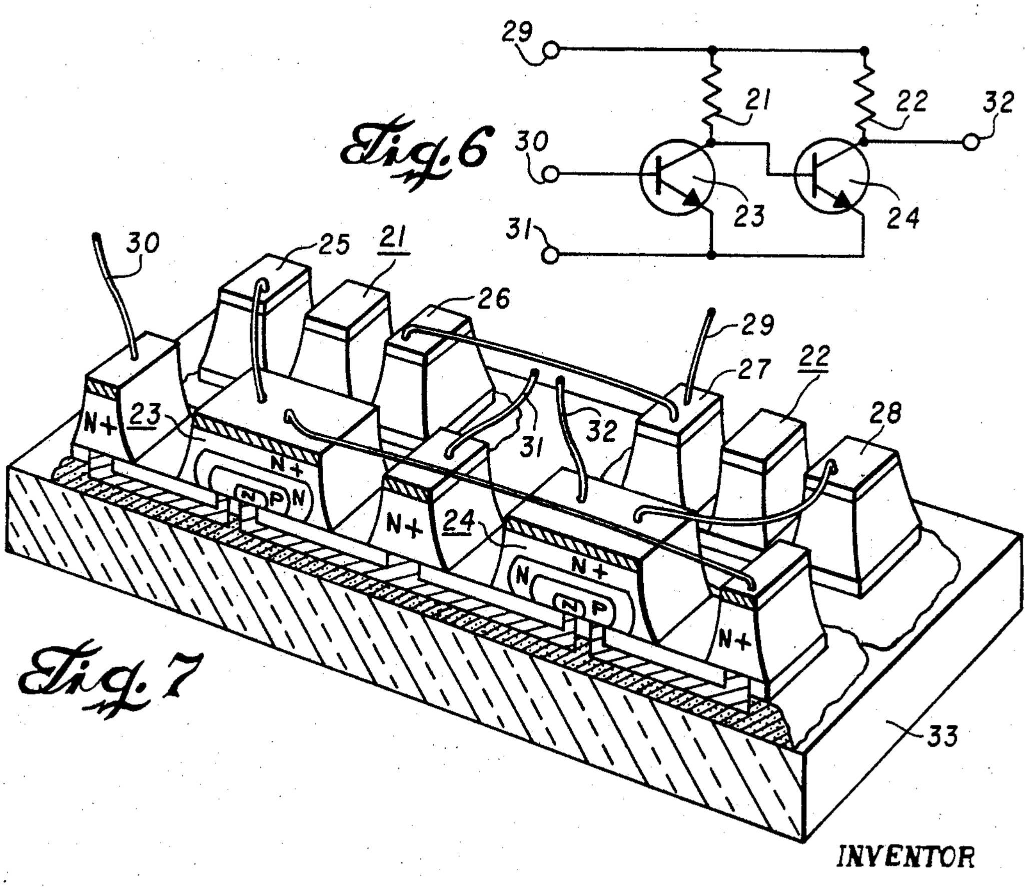
FIGURE 6 illustrates a schematic representation of a simple circuit easily adaptable to integrated circuit fabrication processes according to the invention.
FIGURE 7 illustrates a pictorial view of an integrated circuit fabricated according to the invention embodying the circuit of FIGURE 6.

It will be appreciated that while the device of FIGURE 2 has been illustrated as comprising one transistor diffused into a semiconductor wafer, this has been done for the sake of simplicity in pointing out the salient features of the invention as further illustrated in FIGURES 6 and 7. While the preferred embodiment comprises a semiconductor wafer of silicon, into which a silicon NPN transistor is diffused, it is obvious that the wafer and transistor are merely illustrative and are in no sense meant to be construed as a limitation upon the invention. Thus the wafer could be N or P-type silicon, germanium or any other available semiconductor material and the transistors could be any number (not limited to one) and any combination of NPN and PNP devices all interconnected as a circuit. There could also be resistors (as shown in FIGURES 6 and 7) and capacitors (not shown) in the circuit, all or any of which are to be construed as being within the scope of the invention as defined in the appended claims.

With reference to FIGURE 3, the device of FIGURE 2 is inverted and mounted to a ceramic substrate 11, utilizing an insulating adhesive material 10 such as cement, glass or epoxy, to cause one surface of the device to adhere to the substrate. Alternatively, the insulating material 11 could be deposited onto the silicon wafer, such as by deposition of a thick layer of quartz. The opposite, or top, surface 1 is then lapped or etched away down to a thickness of perhaps 1 mil, removing part 1' of the N+ material to simplify the subsequent selective etching. Gold or gold over molybdenum is then evaporated onto the top surface and selectively removed except over what will later be mesa tops, leaving gold contacts 15, 16 and 17. The opposite surface is then selectively masked by photoresist methods against the subsequent etching operation. Of course, the masking process step could be performed prior to mounting the device upon the substrate. A selective etchant, such as CP8 by way of example, described in "Transistor Technology," vol. 2, edited by F. J. Biondi, at page 598, is applied to the masked surface to remove the semiconductor material 1 between the "islands" 12, 13 and 14, as illustrated in FIGURE 4.

Figure 5:
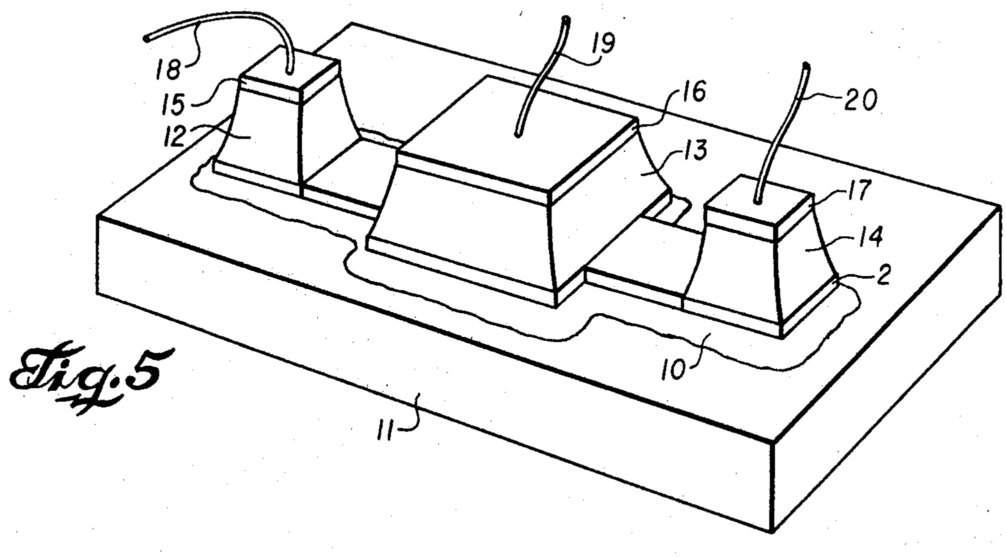
FIGURE 5 illustrates a pictorial view of the device of FIGURE 4.

As shown in FIGURES 4 and 5, the "islands" of the silicon wafer 1 which were not removed by the etch are now mesa-shaped, with metallized contacts 15, 16 and 17 on top. External leads 18, 19 and 20 are then respectively attached to these contacts, as by ball bonding, thereby to produce a device having a transistor with all necessary leads, a strong mechanical structure, air-isolation between elements of the transistor, and a reduced collector area with its resulting lower stray capacitance.

As illustrated in FIGURE 7, a simple circuit, such as shown in FIGURE 6, comprising two transistors 23 and 24 and two resistors 21 and 22, is produced in a semiconductor wafer in a similar manner as described for the one transistor shown in FIGURE 4, except that the resistors 21 and 22 normally require only one diffusion step and have no rectifying junctions. Of course, a different conductivity type than that of the resistors could be diffused around each or both of them, as is done in the conventional PN junction isolation resistor diffusion processes. But such is not necessary in the present embodiment of the invention. FIGURE 6 schematically shows such a circuit, admittedly simple, made so in order to illustrate an operative circuit which utilizes the invention. FIGURE 7 shows the resistors 21 and 22, with their respective metallized contacts. It likewise illustrates the transistors 23 and 24, along with the interconnections necessary to complete the circuit of FIGURE 6. It should be appreciated that, as with a single transistor, the transistors of this circuit have a reduced collector region and a lesser capacitance. All of the external leads 29, 30, 31 and 32 make ohmic contact to the metallized contacts of the circuit elements, as do the interconnecting metallized regions, all of which may be done by any conventional technique, such as by ball bonding. Substrate 33, of some material such as is described in reference to the substrate 11 of FIGURE 4, can then be mounted on a suitable header (not shown) to result in a packaged device.

While the circuit device of FIGURE 7 has been illustrated as embodying the invention, such a circuit (as in FIGURE 6) forms no part of the invention and is in no sense to be construed as a limiting factor, but is merely shown and described to illustrate one of a large number of circuits which could be embodied in an integrated circuit device fabricated according to the invention. Although the invention has been described in a simplified form with respect to a small wafer that involves only the isolation of a few elements, it will be appreciated that the invention is equally applicable to more complicated configurations wherein a larger multiplicity of elements are to be isolated within a single unit.

What is claimed is:

1. An improved integrated circuit device comprising:
(a) a plurality of semiconductor regions of high conductivity material, some of said regions having a region of lesser conductivity material therein and at least one of said lesser conductivity regions having a semiconductor device formed therein, each of said plurality of regions having at least one surface which is substantially coplanar with each other;
(b) first metallized contact regions in respective ohmic contact with some of said coplanar surfaces;
(c) an insulating substrate mounted in juxtaposition to said coplanar surfaces;
(d) second metallized contact regions in respective ohmic contact with some of said plurality of regions of high conductivity material remote from said substrate; and
(e) leads ohmically attached to said second metallized contact regions.

2. An improved transistor comprising:
(a) a semiconductor body of high conductivity material having a collector region of a lesser conductivity material therein, a base region diffused into said collector region, and an emitter region diffused into said base region, said base and emitter regions each having at least one surface which is substantially coplanar with each other;
(b) first metallized contact regions in respective ohmic contact with said coplanar base and emiter surfaces;
(c) an insulating substrate, with said coplanar base and emitter surfaces mounted on said substrate;
(d) a plurality of semiconductor regions of high conductivity material isolated from each other and from said semiconductor body, said plurality of regions being in respective ohmic contact with said first metallized contact regions;
(e) second metallized contact region on said regions of high conductivity material and on said body of high conductivity material remote from said substrate; and
(f) leads ohmically attached to said second metallized contact regions.

3. A semiconductor device comprising:
(a) a semiconductor body having
(i) a first region of one conductivity type therein extending to one surface of said body and then defining a first enclosed area,
(ii) a second region of opposite conductivity type contiguous to and surrounded by said first region and forming therewith a first PN junction, said second region extending to said one surface of said body and there defining a second enclosed area,
(iii) a third region of opposite conductivity type contiguous to and surrounding said first region and forming therewith a second PN junction, said third region extending to said one surface and there defining a third enclosed area, and
(iv) a fourth region of said opposite conductivity type contiguous to and surrounding said third region and having a higher conductivity than said third region, and fourth region extending to another surface of said body and there defining a fourth area;
(b) a first conductor ohmically connected to said first region at said one surface of said body;
(c) a second conductor ohmically connected to said second region at said one surface of said body;
(d) a third conductor ohmically connected to said fourth region at said another surface of said body;
(e) at least one highly conductive semiconductor member positioned adjacent to and insulated from said body, one of said first and second conductors being ohmically connected to one surface of said one member; and
(f) a fourth conductor ohmically connected to another surface of said one member.

4. A semiconductor device according to claim 3 and further including:
(a) at least one additional highly conductive semiconductor member positioned adjacent to and insulated from said body;
(b) the other of said first and second conductors being ohmically connected to one surface of said additional member; and
(c) a fifth conductor ohmically connected to another surface of said additional member.

5. A semiconductor device according to claim 4 and further including:
(a) an insulating substrate attached to said body adjacent said one surface thereof; and
(b) said first and second conductors extending between said body and said insulating substrate, and said fourth and fifth conductors being ohmically connected to their respective other surfaces of said one and additional members remote from said insulating substrate.

6. An integrated circuit comprising an insulating substrate, a plurality of separated semiconductor wafer parts secured to one surface of said substrate, a circuit element comprising a plurality of regions of one of said wafer parts adjacent said insulating substrate, a conductor ohmically connected to one of said regions and extending between said one wafer part and said substrate and an electrical connection to said conductor comprising another one of said wafer parts having one conductivity type throughout and being highly conductive, said another wafer part being ohmically connected to said conductor, and a contact connected to said another wafer part remote from said substrate.

7. A semiconductor device comprising a first semiconductor body having a PN junction therein terminating at one surface of said first semiconductor body, an insulating substrate, said one surface of said first semiconductor body being secured to said insulating substrate, a first conductor extending between said one surface of said first semiconductor body and said insulating substrate ohmically connected to said one surface of said first semiconductor body on one side of said PN junction, a second semiconductor body having a highly conductive path of one conductivity type between opposite surfaces thereof, secured to said insulating substrate, said second semiconductor body being separated from said first semiconductor body, said first conductor being ohmically connected to said highly conductive path at one of said opposite surfaces of said second semiconductor body and a second conductor ohmically connected to said highly conductive path at the other of said opposite surfaces of said second semiconductor body.

References Cited

UNITED STATES PATENTS

| | | | |
|---|---|---|---|
| 3,275,910 | 9/1966 | Phillips | 317—235 |
| 3,298,880 | 1/1967 | Takeshi Takagi et al. | 148—191 |
| 3,320,485 | 5/1967 | Buie | 317—101 |
| 3,335,338 | 8/1967 | Lepselter | 317—234 |
| 3,341,755 | 9/1967 | Husher et al. | 317—235 |
| 3,343,255 | 9/1967 | Donovan | 29—577 |
| 3,362,858 | 1/1968 | Knopp | 148—177 |
| 3,158,788 | 11/1964 | Last | 317—101 |
| 3,246,162 | 4/1966 | Te Ning Chin | 250—211 |
| 3,277,351 | 10/1966 | Hiroe Osofune et al. | 317—234 |
| 3,290,753 | 12/1966 | Chang | 29—25.3 |

JOHN W. HUCKERT, Primary Examiner

R. SANDLER, Assistant Examiner

U.S. Cl. X.R.

29—578